US005548523A

United States Patent [19]
Wehrli, III et al.

[11] Patent Number: 5,548,523
[45] Date of Patent: Aug. 20, 1996

[54] MONITORING DEVICE SECURED TO POWER DISTRIBUTION SYSTEM CONDUCTORS

[75] Inventors: Henry A. Wehrli, III, Monroeville, Pa.; James A. Bauer; Denis A. Mueller, both of Asheville, N.C.

[73] Assignee: Eaton Corporation, Cleveland, Ohio

[21] Appl. No.: 262,166

[22] Filed: Jun. 20, 1994

[51] Int. Cl.$^6$ .................................................. G01R 21/06
[52] U.S. Cl. ........................................... 364/483; 439/391
[58] Field of Search ................................. 364/480, 481, 364/483, 492, 550; 439/391, 415, 416

[56] References Cited

U.S. PATENT DOCUMENTS 698,218  4/1902  Norden ................................... 439/416

5,420,799  5/1995  Peterson et al. ........................ 364/483

Primary Examiner—Ellis B. Ramirez
Assistant Examiner—Edward Pipala
Attorney, Agent, or Firm—Martin J. Moran

[57] ABSTRACT

Apparatus for monitoring power consumed from anywhere along the conductors in an ac power distribution system includes a housing with through passages through which the conductors extend. Toroidal coils mounted within the housing concentrically with the through passages sense the current in the conductors. Elongated electrically conductive screw fasteners threaded into support blocks mounted on a printed circuit board within the housing extend radially into the through passages to penetrate insulation on the conductors and to electrically contact and mechanically clamp the conductors thereby simultaneously providing a voltage tap and locking the housing to the conductor.

5 Claims, 4 Drawing Sheets 5,548,523

MONITORING DEVICE SECURED TO POWER DISTRIBUTION SYSTEM CONDUCTORS

CROSS REFERENCE TO RELATED APPLICATIONS

U.S. patent application Ser. No. 07/746,019 filed on Aug. 15, 1991, now U.S. Pat. No. 5,384,712, for Energy Monitoring System for a Plurality of Local Stations with Snapshot Polling from a Central Station.

U.S. patent application Ser. No. 08/185,668, filed on Jan. 21, 1994, now U.S. Pat. No. 5,420,799, for Energy Monitoring System for a Plurality of Local Stations with Snapshot Polling from a Central Station which is a division of 07/746,019.

BACKGROUND OF THE INVENTION

1. Field of the Invention

This invention relates to monitoring current and voltage in branches of an ac electrical power distribution system, and more particularly to apparatus which can be locked to the conductors of the ac distribution system at any location along the conductors.

2. Background of Information

The above-referenced related applications and U.S. Pat. No. 5,315,531 disclose a system for monitoring the energy consumed at multiple locations below the electric meter which is typically installed by a utility on the main power lines serving a customer. This system allows the customer to determine consumption for each location below the meter and allocate costs accordingly, if desired.

The energy monitoring system includes a modular unit at each location to be monitored. Each modular unit has a toroidal coil inductively coupled to each phase conductor of the ac distribution system by passing the conductor through the coil. The coils are mounted in a housing having through passages extending through the toroidal coils so that the conductors pass completely through the housing. Stabs extending from the housing adjacent the through passages engage the terminals on a circuit breaker together with the ac conductors to provide a voltage pick-up for the unit and to secure the unit to the circuit breaker. Thus, these units are referred to as piggy back units since they are mounted to the circuit breaker.

The piggy back units include circuitry which digitizes the analog currents and voltages sensed by the toroidal coils and the stabs, respectively, and calculates power and energy consumed utilizing an on board microprocessor. The energy monitoring system also includes a central, personal computer (PC) which is linked to each of the piggy back units by a simple two-wire synchronous communication line daisy chained between the units and the PC. The PC gathers the calculations generated by each of the local units for use in allocating billing.

The piggy back units are dimensioned to match the dimensions of the circuit breaker and can be secured to the circuit breakers mounted in a load center without requiring modifications to either the circuit breaker or the load center. There is a need; however, to be able to tap the monitoring units into the power distribution system at locations other than at a conductor termination, as is currently required for the voltage stab.

There is a further need for a monitoring apparatus which can monitor the current and voltage at any point along the conductors of the power distribution system and which does not require stripping of the conductor for the voltage connection.

There is also a need for such a monitoring apparatus which can lock the monitoring unit simply to any location along the conductor.

SUMMARY OF THE INVENTION

These needs and others are provided by the invention which is directed to apparatus for monitoring current and voltage and for making energy calculations therefrom and which can be locked to any point along the electrical conductors of an ac power distribution system. In particular, the apparatus includes a housing having through passage means extending completely through the housing. A separate through passage is provided for each of the conductors. Combination mounting and voltage sensing means include elongated electrically conductive fastener means extending from the housing laterally into the through passages. These fasteners have pointed ends which pierce insulation on the conductors to electrically contact and mechanically clamp the electrical conductors passing through the passages. The housing includes toroidal coil means, one toroidal coil for each conductor through which the through passages, and therefore, the electrical conductors pass, to inductively sense the currents in the conductors. The housing also includes circuitry connected to the toroidal coils for measuring the currents and connected to the electrically conductive fasteners to measure the voltages. Preferably, this circuitry includes analog to digital converter means for digitizing the analog currents and voltages detected by the toroidal coils and the fasteners, respectively, and digital processing means for calculating energy consumed. Also preferably, the apparatus includes a communications link for communication with a remote control unit.

The elongated, electrically conductive fasteners are preferably threaded into electrically conductive support blocks recessed in openings in the housing and which are covered with removable electrically insulating closures to protect personnel from contact with the fasteners which are at line voltage.

An electrically insulating sleeve fills in the through passage around smaller diameter conductors. The pointed ends of the elongated electrically conductive fasteners penetrate this sleeve as well as the insulation on the conductor.

The invention provides a simple compact monitor which can be easily and quickly installed at any point along the conductors of an ac power distribution system for monitoring current and voltage.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
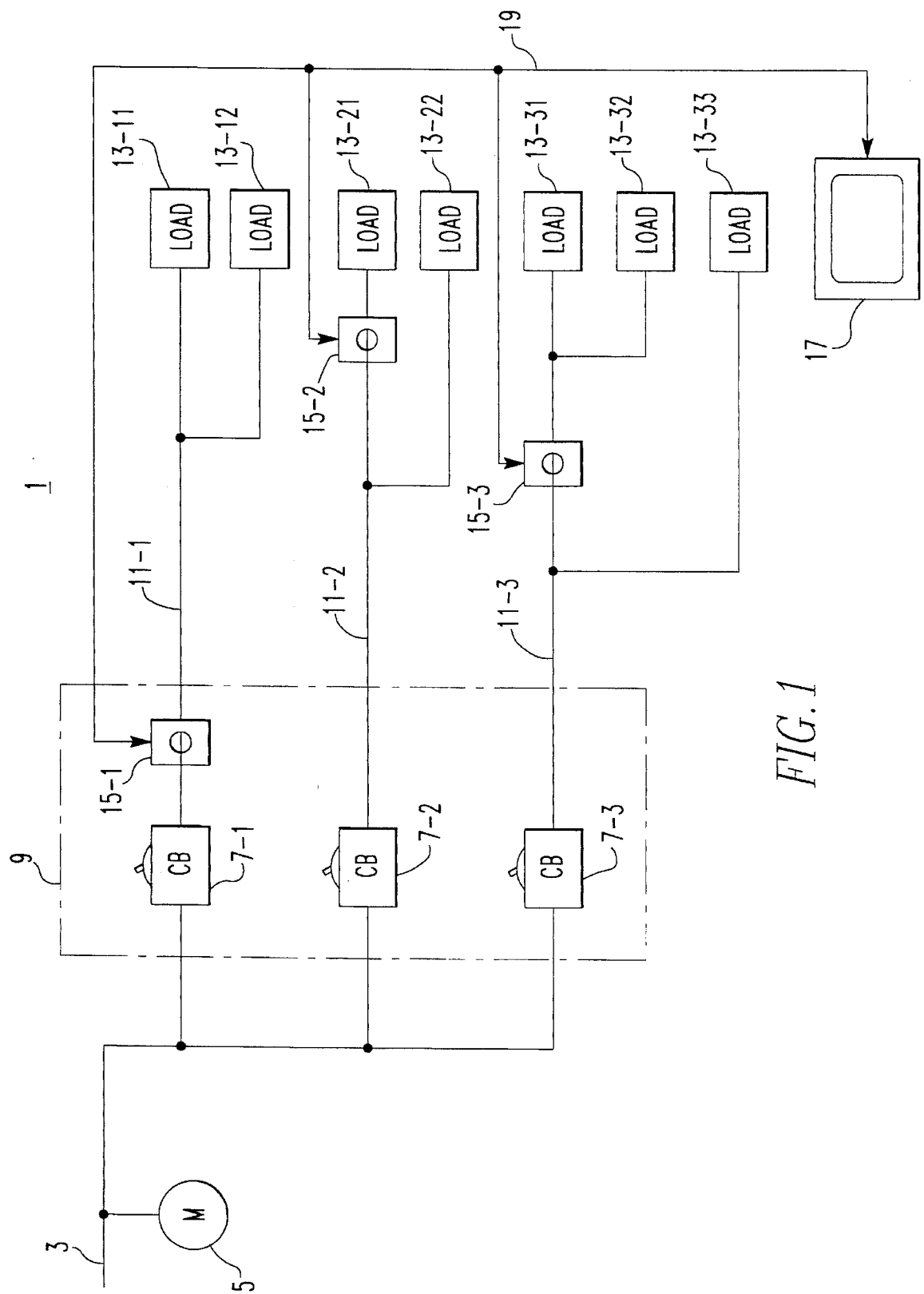
FIG. 1 is a schematic diagram of an ac power distribution system to which the invention has been applied.

FIG. 1 illustrates a secondary ac power distribution system 1 to which the invention has been applied. The secondary ac power distribution system 1 includes a main ac line 3 which provides power generated by the electric utility. The utility places a meter 5 on the main ac line to measure energy consumed by the distribution system 1. The main ac line 3 is connected to a number of circuit breakers 7-1 to 7-3 mounted in a panel board or load center 9. Each of the circuit breakers 7 provides protection for a circuit which includes a load conductor 11 providing power to a load 13.

The conductors 3 and 11 are all represented by a single line for simplicity, but it should be understood that all of these conductors can be multiphase as explicitly shown below. In order to be able to monitor the energy consumed by the individual loads 13, an individual monitoring unit 15-1 to 15-3 is placed on the conductors 11-1 to 11-3 for each of the loads 13-11 to 13-33. In accordance with the invention, these monitoring units 15-1 to 15-3 can be placed anywhere in the distribution system, including anywhere along the conductors 11-1 to 11-3, because unlike the earlier monitoring units described in the above-referenced U.S. patent applications, and U.S. Pat. No. 5,315,531 the monitoring units 15-1 to 15-3 do not have to be mounted directly on the circuit breakers 7-1 to 7-3. Thus, as seen in FIG. 1, the monitoring unit 15-1 can be placed in the panel board or load center 9 where it monitors energy consumed by all of the loads 13-11 and 13-12 protected by an individual circuit breaker 7-1. On the other hand, where the energy consumed by an individual load such as the load 13-21 is of interest, the monitoring unit 15-2 can be placed adjacent the load. Obviously, the invention provides a great deal of flexibility such that a monitoring unit such as 15-3 can monitor multiple loads 13-31 and 13-32, but not all of the loads (not 13-33) on a particular circuit.

The monitoring units 15-1 to 15-3 monitor the current and voltage, in a manner to be discussed below, in the conductor to which they are coupled and calculate power and energy consumed. Except as described below, the units 15-1 to 15-3 are the same as those described in U.S. Pat. No. 5,315,531 which is hereby incorporated by reference. As described in that patent, the individual monitoring units 15-1 to 15-3 are linked to a central unit such as represented by the personal computer (PC) 17 in FIG. 1 through a communications link 19, which in the illustrated embodiment is an INCOM system. The INCOM communications system utilizes a simple two wire synchronous communication line which is daisy chained to the several monitoring units 15-1 to 15-3 and the PC 17. The PC 17 digitally addresses each of the monitoring units 15-1 to 15-3 in a master—slave relationship for the purpose of gathering the data generated by the individual monitoring units for central processing and allocating appropriate portions of the total billing determined by the meter 5 to the local users.

Figure 2:
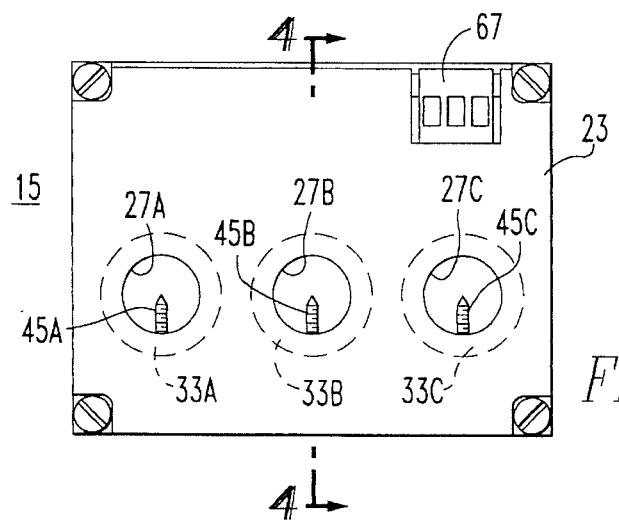
FIG. 2 is a front elevation view of a monitoring unit in accordance with the invention shown mounted on three phase conductors of the distribution system.
Figure 3:
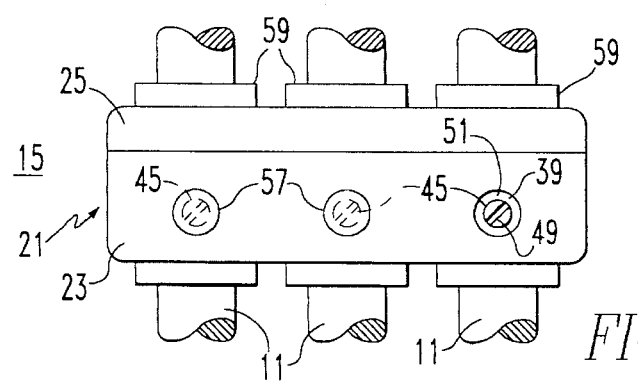
FIG. 3 is a bottom plan view of the monitoring unit of FIG. 2.
Figure 4:
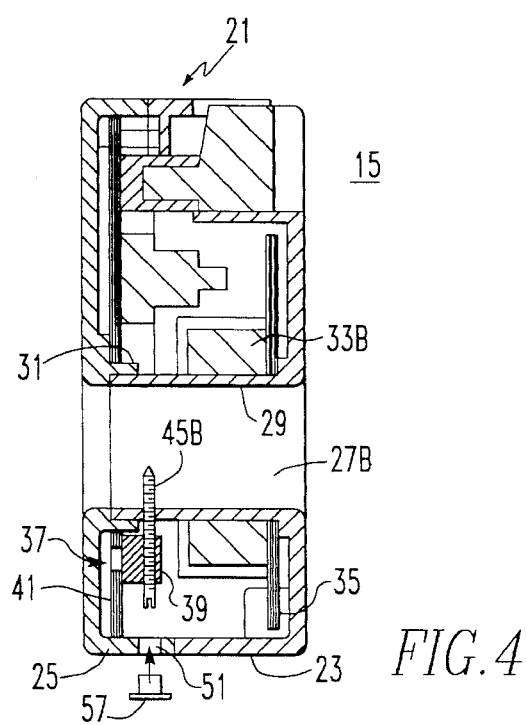
FIG. 4 is a vertical section view through the monitoring unit taken along the line 4—4 in FIG. 2 shown with the conductor removed.
Figure 6:
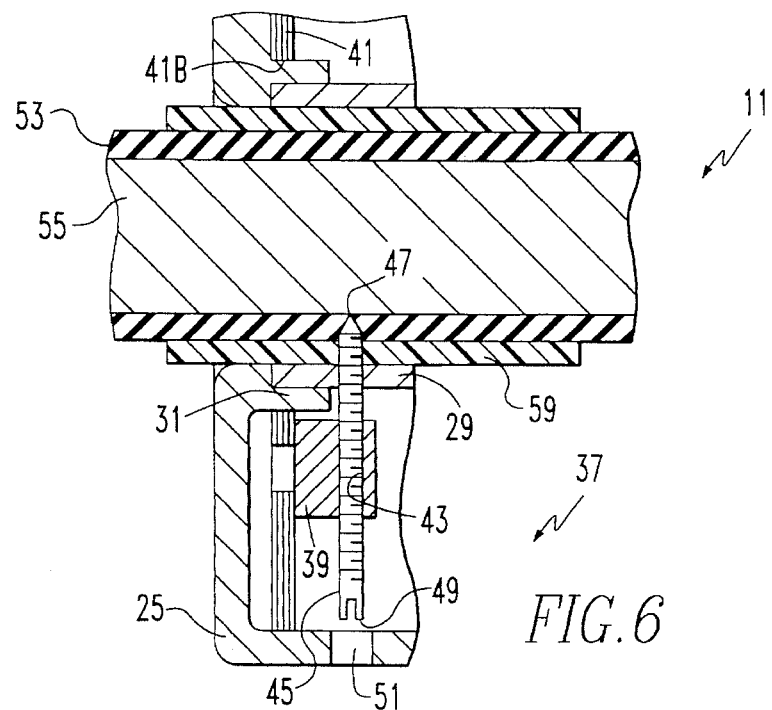
FIG. 6 is a vertical sectional view through the assembly shown in FIG. 5 taken along the line 6—6.
Figure 5:
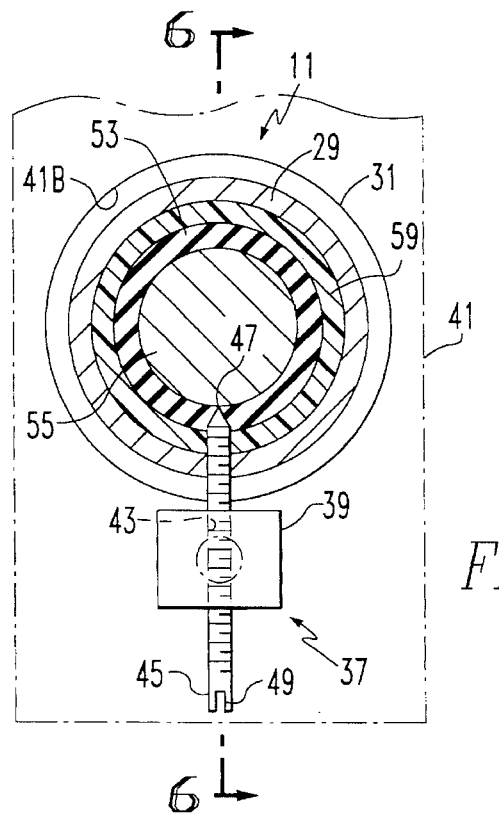
FIG. 5 is a fragmentary view illustrating a combined mount and voltage tap which forms part of the monitoring unit of FIGS. 2–4 shown mounted on a printed circuit board (PCB) and engaging a conductor of the distribution system.

Turning to FIGS. 2 and 3, the monitoring units 15 comprise a housing 21 which includes a molded casing 23 with a molded cover 25. A through passage 27A–27C provided for each phase of the conductor 11 passes completely through the housing 21. As shown in FIG. 4, a tubular portion 29 of the casing 23 and a mating tubular portion 31 of the cover 25 form the through passages 27. A toroidal coil 33A to 33C is mounted within the housing 21 concentric with each of the through passages 27A–27C. These toroidal coils 33A–33C are mounted on a printed circuit board (PCB) 35. A combined mount and voltage tap 37 as best seen in FIGS. 5 and 6, comprises an electrically conductive support block 39 which is pinned or soldered to a second PCB 41 having openings 41A, 41C and 41C which align with the opening 27A–27C. The support block 39 has a threaded through bore 43. An elongated threaded fastener 45 is threaded into the threaded bore 43 and extends generally radially into the associated through passage 27. The elongated threaded fastener 45 has a sharpened point 47. Both the fastener 45 and the support block 39 are preferably made of copper plated with silver for good electrical conductivity.

As shown in FIGS. 4–6, the phase conductors 11 for the load to be monitored are passed through the through passages 27A–27C. And thus through the toroidal coils 33A–33C which inductively sense the current flowing in the conductors. Each elongated fastener 45 which is slotted at 49 is accessible through an opening 51 in the housing 21. A screw driver engages the slot 49 to thread the fastener through the block 39 into the passage 27A–27C. The pointed end 47 of the fastener 45 penetrates the insulation 53 on the conductor 11 and the conducting wire 55 to thus make electrical contact with the wire 55. Fastener 45 also mechanically clamps the conductor 11 within the through passage 27 to thereby lock the monitoring unit 15 to the conductor. Normally the passage 51 is plugged with an insulating plastic plug 57 to prevent an inadvertent contact with the fastener 45 which is at line potential.

The through passages 27 are sized to accommodate various size conductors. For conductors smaller than the maximum size that can be accommodated, an insulating sleeve 59 is provided which allows the smaller conductor to be clamped with its axis concentric with that of the toroidal coil 33. (See FIG. 3). The pointed end 45 also penetrates this sleeve 59.

Figure 7:
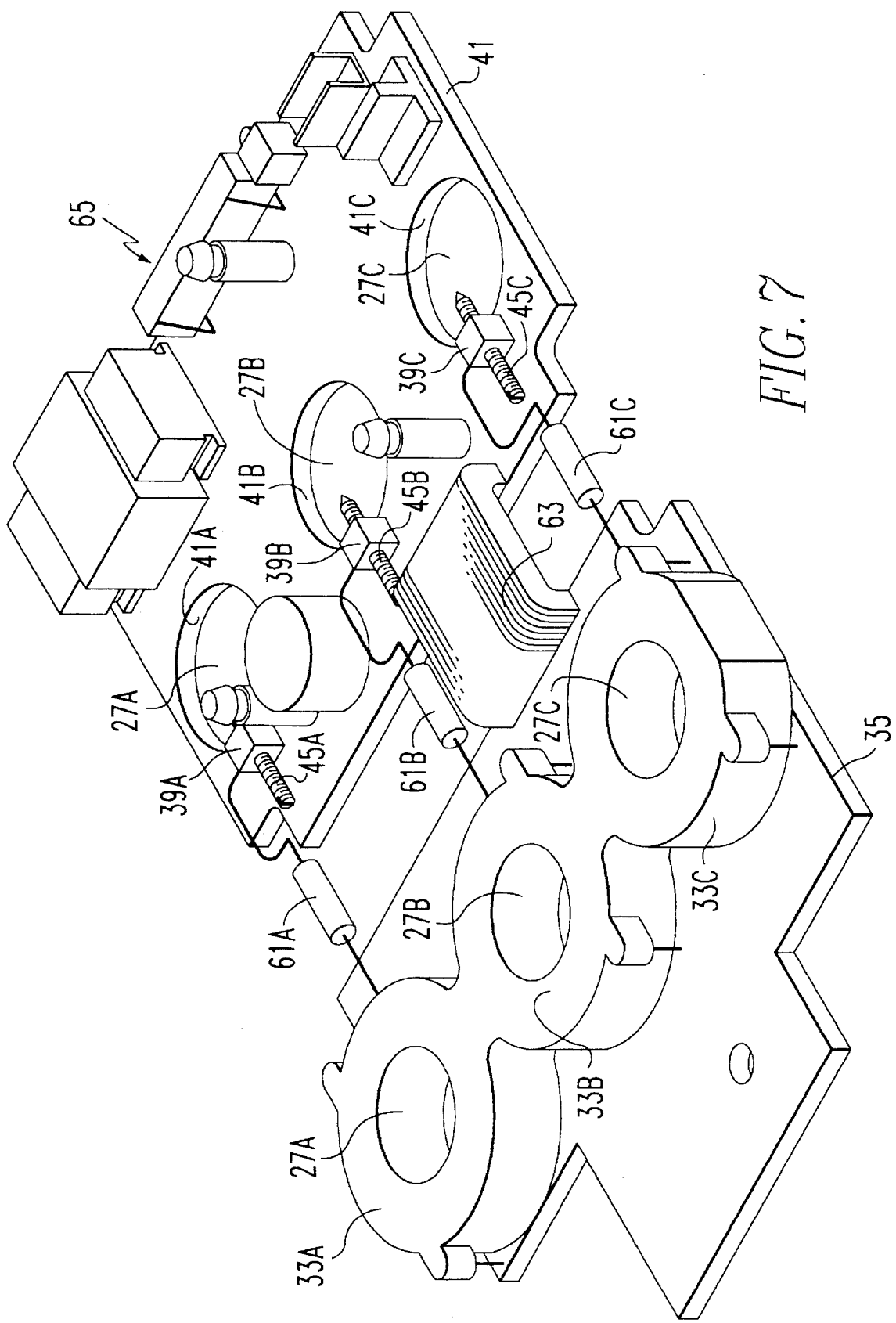
FIG. 7 is a laid open view of the PCBs of the monitoring unit showing the current sensing coils, voltage taps and circuitry mounted thereon.

As seen in FIG. 7, the electrically conductive support blocks 39 are connected by resistors 61 to PCB 35 on which the coils 33A–33C are mounted on the PCB 41. As described in detail in U.S. Pat. No. 5,315,531, the analog voltage signals derived by the combined mount and voltage taps 37, and the analog current signals generated by the toroidal coils 33, are transferred by ribbon connector 63 to PCB 41 where they are converted to digital signals for calculation of the energy consumed by circuits identified generally by the reference character 65. The circuitry 65 can include the custom Sure Plus integrated circuit chip (IC) described in U.S. Pat. No. 5,270,898 which is hereby incorporated by reference. This IC includes an analog to digital converter, a microprocessor and a communications interface by which the calculated energy consumed is provided to the communications link 19 through a connector 67 in the housing 21.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for monitoring voltage and current anywhere along electrical conductor means covered with electrical insulation in an ac power distribution system, said apparatus comprising:

a housing having through passage means through which said conductor means passes completely through said housing;

combined mounting and voltage tap means comprising elongated electrically conductive fastener means extending from said housing laterally into said through passage means and having a pointed end which penetrates said electrical insulation covering said electrical conductor means and electrically contacts and mechanically clamps said electrical conductor means in said through passage means to lock said housing on said electrical conductor means;

toroidal coil means within said housing and through which said through passage means and said electrical conductor means extend for sensing current flowing through said electrical conductor means; and circuit means within said housing connected to said toroidal coil means for monitoring current flowing in said electrical conductor means and connected to said electrically conductive fastener means for measuring voltage on said electrical conductor means.

2. The apparatus of claim 1 wherein said combined mounting and voltage tap means further includes electrically insulating sleeve means in said through passage means and through which said electrical conductor means extends, said elongated electrically conductive fastener means piercing and extending through said electrically insulating sleeve means.

3. The apparatus of claim 1, wherein said ac power distribution system is a multiphase ac system comprising a plurality of electrical conductors each covered with electrical insulation, wherein said through passage means comprises a circular through passage through said housing for each of said electrical conductors, wherein said elongated electrically conductive fastener means comprises an elongated electrically conductive fastener extending from said housing substantially radially into each of said circular through passages, piercing the electrical insulation on an electrical conductor extending through said circular through passage and electrically contacting and mechanically clamping said electrical conductor in said through passage to lock said housing on said conductors, and wherein said toroidal coil means comprises a separate toroidal coil through which each of said through passages extends, wherein said circuit means is connected to each toroidal coil for measuring current in each electrical conductor and is connected to each of said elongated electrically conductive fasteners for measuring voltages on said electrical conductors.

4. The apparatus of claim 3 wherein said housing has electrically conductive support blocks with threaded bores aligned substantially radially with each of said through passages, wherein said elongated electrically conductive fasteners comprise pointed screws threaded into said threaded bores and extending substantially radially into said through passages, and wherein said circuit means is connected to said elongated electrically conductive fasteners through said electrically conductive support blocks.

5. The apparatus of claim 4 wherein said support blocks are recessed in said housing, said fasteners threaded into said support blocks being accessible through openings in said housing and said housing further having electrically insulating removable closures closing said openings.

* * * * *